United States Patent [19]

Cauldwell

[11] 3,996,880
[45] Dec. 14, 1976

[54] FIELD STRENGTH METER
[75] Inventor: Jack D. Cauldwell, Dayton, Ohio
[73] Assignee: Arvin Industries, Inc., Columbus, Ind.
[22] Filed: July 28, 1975
[21] Appl. No.: 599,374

Related U.S. Application Data
[62] Division of Ser. No. 477,776, June 10, 1974, Pat. No. 3,908,165.
[52] U.S. Cl. .............................. 116/129 S; 116/134
[51] Int. Cl.² ........................................... G09F 9/00
[58] Field of Search ........ 116/129 S, 129 R, 129 T, 116/124.1 R, 124.2 R, 134; 324/99 D, 115; 325/455; 340/378 B

[56] References Cited
UNITED STATES PATENTS

| | | | |
|---|---|---|---|
| 2,073,417 | 3/1937 | Fox et al. ....................... | 325/455 X |
| 2,624,835 | 1/1953 | Lear ................................ | 325/455 |
| 2,765,764 | 10/1956 | Belt .............................. | 116/124.1 R |
| 3,285,078 | 11/1966 | Siebold .................... | 116/124.1 R X |
| 3,464,011 | 8/1969 | Beckmann ....................... | 324/99 R |

FOREIGN PATENTS OR APPLICATIONS 799,398 6/1936 France .......................... 116/129 T Primary Examiner—Richard C. Queisser
Assistant Examiner—Daniel M. Yasich
Attorney, Agent, or Firm—Biebel, French & Nauman

[57] ABSTRACT

A signal strength meter indicates signal level directly in dBmV. The signal under test is attenuated to a level which centers a meter indicator, and the attenuator movement is translated into numerical direct reading information of signal level. Push button switches select a channel for testing, and each switch incorporates gain compensation for the frequency of the signal to be tested. Within each channel the operator can select between audio and video carrier frequency.

3 Claims, 2 Drawing Figures

FIELD STRENGTH METER

CROSS-REFERENCE TO RELATED APPLICATION

This application is a division of application Ser. No. 477,776, filed June 10, 1974 now U.S. Pat. No. 3,908,165, issued Sept. 23, 1975.

BACKGROUND OF THE INVENTION

This invention relates to a signal level instrument which is useful in accurately determining the level or amplitude of various R.F. signals. There are a number of uses for such instruments, the most prevalent of which is in connection with the testing and alignment of cable television signals. A technician must verify the level of signal present at various points in the cable system, for example at all the terminals, junctions, etc., and due to this he often must carry a portable instrument up a pole to some connection point, attach a probe or lead of the instrument, and then use the instrument to check the signal level on all of the various channels available in the system.

At present the Federal Communications Commission requires 20 channel capability of cable television systems, thus the technician may have to check the signal level in that many different channels, or more, depending upon the capacity of the system. In addition, these systems utilize a low band pilot signal, typically around 75 MHz, and a high band pilot signal which is typically in the order of 180 to 300 MHz to keep the system balanced. The pilot signals provide fixed references against which the trunk line amplifiers can automatically adjust to maintain an essentially constant level over a wide range of temperature conditions. These pilot signals must also be checked for signal level.

In different cable television systems, some channels may be provided below the lowest VHF channel (channel 2), on which additional television and/or communication signals can be provided. These are commonly referred to as the "sub-low" channels. They are also sometimes used for two-way communication within the system, for example where local live television signals may be originated in the system's area, transmitted on one of the sub-low channels to the antenna and processor, and then converted to be transmitted back into the system on one of the unused VHF channels.

In addition, a number of "mid-band" channels are available within the VHF spectrum, between channels 6 and 7 together with so-called "super-band" channels above the frequency of VHF channel 13. Both the mid-band and superband channels can be used for video or data transmission within the system. By way of example, a subscription type adapter can be used to receive and decode special programs such as movies transmitted on these channels.

In all, a signal level instrument may be required to have a total band width encompassing some 36 different channels, and it may be necessary for the technician to check individually the signal level on a large percentage of these. Present instruments used for this purpose provide a calibrated meter from which the technician must read a signal level value, usually in the range of 0–20 dBmV, which must be subtracted from the attenuation setting manually preset into the instrument through a bandswitch. This value must be compensation, by use of a chart from which a compensation adjustment is set into the instrument, depending upon the frequency of the instrument, depending upon the frequency of the signal being tested. Thus, when the technician must perform these operations, with the presently used instruments, while on a pole, and make the necessary adjustments, recordings, calculations, etc., there is considerable chance for error to be introduced in the recorded values. Furthermore, although gain compensation may be built into such instruments, it has been common practice to compromise the gain compensation over the range of the instrument, in which case the compensation may not be precisely accurate for any given channel.

SUMMARY OF THE INVENTION

The present invention provides a novel and convenient signal level instrument which is completely portable, having capability of handling 36 channels encompassing the VHF television spectrum, including the low-band and high-band pilot signals, and the sub-band, mid-band and super-band channels. Each channel can be selected with a separate push button operated switch. Within each selected channel, a further selection can be made between carrier frequency of video and audio signals where such are present in the particular channel under test. Instead of reading a value from a meter scale, this instrument provides a centering or null type meter which the operator needs only to adjust to a predetermined reading position. The value of the signal level is read out digitally, direct reading, with gain compensation automatically included and individually calibrated for the frequency of the same channel under test. The digital readout remains in view of the operator until he begins the next test operation.

To use the instrument, it is necessary for the operator only to a. depress the appropriate channel push button
b. adjust a pair of attenuators until he observes a predetermined indication on the meter and
c. read the signal level in dBmV directly from a digital readout coupled to the attenuator.

Therefore, the operator need only select the channel, manipulate the attenuator controls to obtain center reading on the meter, and then record the value shown on the digital readout. Where there is a television signal on the particular channel, including audio and video signals, the operator need only adjust a selector switch from video to audio positions, and adjust the attenuator controls each time, in order to check separately the signal levels at the carrier frequencies of both the audio and video signals within the channel under test.

The basic instrument incorporates a two-step attenuator control, arranged in decade fashion with the input signal being connected first through an adjustable attenuator which operates in ten db steps, then through a second attenuator which operates in one db steps. The attenuated signal is fed to a mixer, which also is fed from a variable frequency oscillator, preferably a voltage controlled oscillator. Basically, the function of the instrument is to attenuate the signal unser test to a predetermined level, then with the mixer provide a reference signal(s) which is at the predetermined attenuated level and a predetermined frequency or frequencies.

The push button operated channel selector performs two basic functions, it selects and provides a control voltage signal which determines the frequency of a voltage controlled oscillator, and it also provides a gain adjustment which is unique to the selected channel and is applied to a driver amplifier which in turn drives the indicating meter. Thus, selection of a particular channel provides individually calibrated compensation for that channel to the meter driver, and also sets the frequency of the voltage controlled oscillator such that in the mixer the attenuated signal under test is mixed (down or up), to one or more intermediate frequencies. These signals are then further processed and supplied to the meter driver amplifier.

Digital indicators are controlled by the manual adjustments for the attenuators, thus providing a digital indication of the amount of attenuation necessary to drive the meter to a predetermined position, preferably a center reading or null position. Preferably these indicators are cooperating dials on a stepwise rotatable attenuator controls. These dials cooperate with viewing windows to provide a digital readout which is a direct reading of R. F. level information in dBmV. plus or minus.

The direct reading digital indicator incorporates unique features. The attenuator control knobs also move cooperating numbered dials which present numerals behind adjacent viewing windows. The dial of the higher order knob overlaps the lower order dial, and is provided with radially displaced arcuate transparent segments that selectively uncover one of two different numeral rows on the lower order dial. Those two rows of lower order numerals read in reverse of each other. The numerals on the higher order dial read plus and minus, and the segments are related to these such that different lower order rows actually present numerals, depending on the setting of the higher order dial.

Therefore, the principal object of the present invention is to provide a novel wide range signal level test instrument which is simple to operate, and which provides a direct digital readout of signal level information.

Other objects and advantages of the invention will be apparent from the following description, the accompanying drawings and the appended claims.

DESCRIPTION OF THE PREFERRED EMBODIMENT

Figure 1:
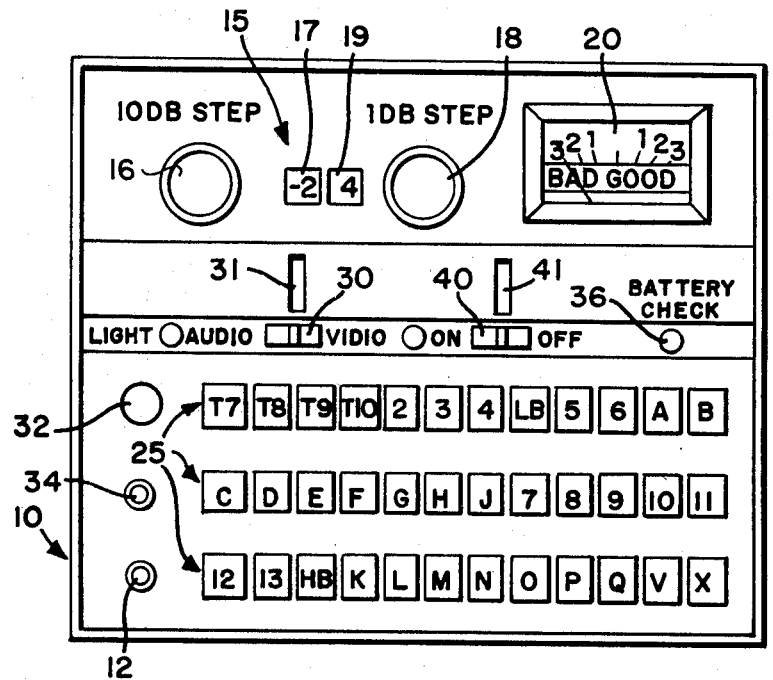
FIG. 1 is a front view of the meter housing and controls.

Referring now to the drawings which show a preferred embodiment of the invention, and particularly to FIG. 1, where a signal level measuring instrument 10 is shown, the signal to be measured is connected to an input connector 12 where the signal passes to an attenuator, shown generally at 15. The attenuator includes a 10 db per step device 16 and associated indicator window 17, and a one db per step device 18 with its indicator associated window 19. A meter 20 is used to assist the operator in adjusting the attenuator 15.

The channel undergoing analysis is selected by one of 36 push button switches shown generally at 25. These switches preferably are arranged in three rows of twelve switches each. The switches which select those channels having a frequency within the range of VHF television stations, i.e., channels 2–6 and channels 7–13, may be of a different color than the remaining switches, and another color may be used for the buttons which select the low-band and high-band pilot signals (LBF and HBF).

The operator may select, by means of switch 30, either the audio or the video portion of the signal in each channel. The position of this switch is visually indicated in window 31. A fine-tuning control 32 is also provided, along with a video output jack 34.

The signal level instrument is battery powered, and a battery test switch 36 may be used in conjunction with the meter 20 (using its "Bad-Good" scale) to test the condition of the batteries. The circuit for this is conventional and thus not shown. An on/off power switch 40 is also provided, and its position is indicated in window 41.

Details of the electronics of the instrument are disclosed in said parent application Ser. No. 477,776, particularly in FIGS. 2 and 3 thereof and corresponding description. These details are omitted here since they are not of importance to the present invention.

Figure 2:
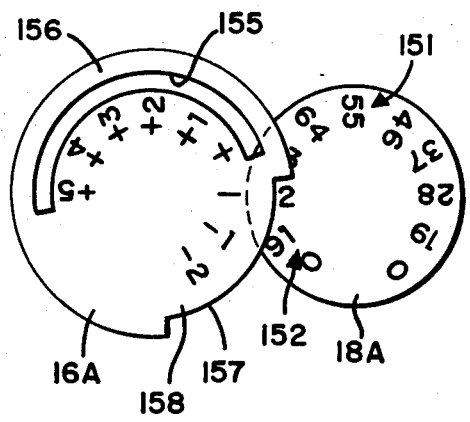
FIG. 2 is a view showing the digital readout mechanism operated between attenuator controls.

FIG. 2 illustrates the digital indicator or readout charts which are associated with the attenuator controls 16 and 18, and the windows or frames 17 and 19 which outline numerals on the charts corresponding to selected values. These numerals provide the digital readout of the instrument. The attenuators are standard detented rotary switches which connect attenuating components (e.g., precision resistors) between the input terminal 12 and the wide band amplifier of the instrument. In operation of the instrument, the attenuators 16 and 18 are rotated until the needle of the meter 20 reaches a predetermined position, preferably a center position. Such rotation also moves the charts 16A and 18A, such that different numerals on the charts appear behind the corresponding windows 17 and 19.

Since the most commonly employed standard equates 0 dBmV to 1 millivolt (mV) across 75 ohms, the meter indication in the preferred embodiment is offset by 30 db, because it is desired that the instrument have a sensitivity to approximately −30 db. The numerical scale on chart 16A therefore is arranged to read from −2 to +5 (−20 to +50 db), and chart 18A carries both a direct reading or outer row of numbers 151, and a reverse reading, or inner row of numbers 152, line of numerals, one for each of the eleven positions of the attenuator.

The scale of chart 16A incorporates screening means which selects an appropriate one of the desired row of numerals on chart 18A, and shields the other row of numerals in the window 19. Thus, the chart 16A contains one arcuate aperture 155 which uncovers the outer row of numerals 151 on chart 18A, while the segment 156 of chart 16A outward of aperture 155 screens the inner row of numerals 152 on chart 18A from view. Therefore, when attenuator 16 is set to any positive value, in steps of 10 db, settings of attenuator 18 will read directly from the outer row of numerals on chart 18A.

A second aperture 157 is formed along a segment of the edge of chart 16A corresponding to the negative reading numerals thereon. This segment uncovers the inner row of numerals 152 on chart 18A, which is reverse reading, and the inner portion 158 of chart 16A shields from view the outer or direct reading row of numerals 151 on chart 18A. Therefore, appropriate manipulation of the two attenuators will bring into view a direct reading two-digit number within the windows 17 and 19, and this value can be read in either plus or minus db depending upon the setting for a particular input signal, as required to center the needle meter on the scale.

There are separate positions for plus and minus on chart 16A, since the actual attenuator values are different for the two zero positions on chart 18A. The plus position on chart 16A introduces attenuation of 30 db and the zero position on row 151 does not introduce any attenuation, with the unit values increasing in attenuation on a scale of one to nine. Conversely, the minus position on chart 16A provides an attenuation of 20 db and the zero position on chart 18A row 152 provides an attenuation of 10db. Thus, for example, a readout setting of −2 db is produced by introducing attenuation of 20 db from attenuator 16 (− position) and an attenuation of 8 db from attenuator 18 (2 position on row 152).

While the form of apparatus herein described constitutes a preferred embodiment of this invention, it is to be understood that the invention is not limited to this precise form of apparatus, and that changes may be made therein without departing from the scope of the invention.

What is claimed is:

1. A digital readout device for presenting a visual indication of a two digit member in positive or negative values, comprising support means,
   a higher order chart mounted on said support means and having a zero position and positive and negative numerals arranged arranged in a line in opposite directions from the zero position according to positive and negative movement,
   a first frame on said support means outlining one of the numerals on said higher order chart,
   means on the support means for moving said higher order chart to present different ones of said numerals in said first frame,
   a lower order chart mounted on said support means adjacent said higher order chart and having separate sets of numerals arranged along parallel lines and reading in complementary fashion,
   a second frame on said support means adjacent said first frame outlining one numeral of each set on said lower order chart,
   means on the support means for moving said lower order chart to present selected numerals from each set in said second frame,
   and screening means attached to said higher order chart and extending across said second frame,
   said screening means having a first aperture coextensive with the positive numerals on said higher order chart that is aligned with one of the sets of numerals on said lower order chart.
   said screening means also having a second aperture coextensive with the negative numbers on said higher order chart that is aligned with the other set of numerals on said lower order chart whereby selective movement of the two charts will present in said frames two digit numbers reading consecutively in ascending or descending fashion from zero.

2. A digital readout device as claimed in claim 1, each of said charts being in the form of circular members mounted for rotation in spaced relation such that said screening means overlaps the numerals on said lower order chart.

3. A digital readout device as claimed in claim 2, wherein each of said charts is a circular dial, and said dials are mounted to rotate about axes spaced on opposite sides of said frames.

* * * * *